(12) United States Patent
Kim et al.

(10) Patent No.: US 11,770,014 B2
(45) Date of Patent: Sep. 26, 2023

(54) UNIVERSAL JIG FOR CHARGING AND DISCHARGING SECONDARY BATTERY CELL

(71) Applicant: WONIKPNE, Suwon-si (KR)

(72) Inventors: Sock Jun Kim, Yongin-si (KR); Seok Min Lee, Suwon-si (KR)

(73) Assignee: WONIKPNE, Suwon-si (KR)

( * ) Notice: Subject to any disclaimer, the term of this patent is extended or adjusted under 35 U.S.C. 154(b) by 258 days.

(21) Appl. No.: 17/469,496

(22) Filed: Sep. 8, 2021

(65) Prior Publication Data
US 2022/0337072 A1    Oct. 20, 2022

(30) Foreign Application Priority Data

Apr. 20, 2021    (KR) .................. 10-2021-0051152

(51) Int. Cl.
| | |
|---|---|
| H02J 7/00 | (2006.01) |
| H01M 10/46 | (2006.01) |
| H05K 7/10 | (2006.01) |
| H05K 7/14 | (2006.01) |
| H05K 7/18 | (2006.01) |

(52) U.S. Cl.
CPC ........... *H02J 7/0042* (2013.01); *H01M 10/46* (2013.01); *H05K 7/1015* (2013.01); *H05K 7/1417* (2013.01); *H05K 7/183* (2013.01)

(58) Field of Classification Search
CPC ....... H02J 7/0042; H01M 10/46; H05K 7/183
USPC ...................................................... 320/107
See application file for complete search history.

(56) References Cited

U.S. PATENT DOCUMENTS

| | | | |
|---|---|---|---|
| 2014/0210413 A1* | 7/2014 | Yoon ..................... | H02J 7/0042 320/110 |
| 2016/0276716 A1* | 9/2016 | Lee ................... | H01M 10/4285 |

FOREIGN PATENT DOCUMENTS

| | | |
|---|---|---|
| KR | 101192059 | 10/2012 |
| KR | 20160009701 | 1/2016 |

OTHER PUBLICATIONS

Extended European Search Report issued in Counterpart European Patent Application No. 21196102.4 dated Feb. 18, 2022.

* cited by examiner

*Primary Examiner* — Nathaniel R Pelton
(74) *Attorney, Agent, or Firm* — NORTON ROSE FULBRIGHT US LLP

(57) ABSTRACT

Disclosed is a universal jig for charging and discharging a secondary battery cell. The universal jig includes a cell zig assembly including: a cell receiving part for receiving the secondary battery cell thereon; and a zig for a positive electrode terminal and a zig for a negative electrode terminal disposed above the cell receiving part and in contact with a positive electrode terminal and a negative electrode terminal of the secondary battery cell to apply current thereto, respectively; and a zig rotation inducing assembly connected, via a rotation center shaft thereof, to one face or an opposite face of the cell zig assembly on which the zig for the positive electrode terminal and the zig for the negative electrode terminal are disposed, wherein the zig rotation inducing assembly allows the cell zig assembly to rotate around the rotation center shaft.

12 Claims, 12 Drawing Sheets

UNIVERSAL JIG FOR CHARGING AND DISCHARGING SECONDARY BATTERY CELL

CROSS-REFERENCE TO RELATED APPLICATION

This application claims a benefit under 35 U.S.C. § 119(a) of Korean Patent Application No. 10-2021-0051152 filed on Apr. 20, 2021, on the Korean Intellectual Property Office, the entire disclosure of which is incorporated herein by reference for all purposes.

BACKGROUND

1. Field

The present disclosure relates to a zig for charging and discharging secondary battery cells. More specifically, the present disclosure relates to a universal jig for charging and discharging a secondary battery cell in which a zig for fixing the secondary battery cell is rotatable.

2. Description of Related Art

In general, secondary batteries that can be charged and discharged are being actively studied under development of portable electronic devices such as cellular phones, notebook computers, and computer camcorders.

In particular, the secondary batteries include nickel-cadmium batteries, lead-storage batteries, nickel metal hydride batteries, lithium ion batteries, lithium polymer batteries, metal lithium secondary batteries, and zinc air batteries.

The secondary batteries may have output properties varying depending on surrounding environmental conditions. For example, the output properties of the secondary battery may vary depending on an ambient temperature state, external shock or vibration applied to the secondary battery, etc. Therefore, it is necessary to pre-check the output properties the secondary battery under the environmental conditions in which the secondary battery is actually used.

To this end, a secondary battery cell test is conducted by placing a plurality of secondary battery cells in a chamber, creating a specific environment inside the chamber, charging and discharging the secondary battery cell in the corresponding environment, and measuring an operation state of the secondary battery cell. In this connection, a zig for charging and discharging that fixes the secondary battery cell while a positive electrode terminal and a negative electrode terminal of the cell face upward is used. The secondary battery cell with the zig is put into the chamber while the cell stands upright.

Conventionally, when charging and discharging the secondary battery cell, the secondary battery cell stands upright and is put into the chamber. Therefore, while the secondary battery cell only stands upright, the charging/discharging test is performed. Therefore, the charging/discharging test is limited to an environment in which the secondary battery cell stands upright.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a universal jig for charging and discharging a secondary battery cell that allows a charging/discharging test to be performed in a state in which the secondary battery cell has rotated by various angles.

Another purpose of the present disclosure is to provide a universal jig for charging and discharging a secondary battery cell which enables easy rotation of the secondary battery cell and the cell zig assembly without securing an additional space used for rotating the secondary battery cell and the cell zig assembly other than a chamber in which the charge/discharge test is performed.

One aspect of the present disclosure provides a universal jig for charging and discharging a secondary battery cell, the universal jig comprising: a cell zig assembly including: a cell receiving part for receiving the secondary battery cell thereon; and a zig for a positive electrode terminal and a zig for a negative electrode terminal disposed above the cell receiving part and in contact with a positive electrode terminal and a negative electrode terminal of the secondary battery cell to apply current thereto, respectively; and a zig rotation inducing assembly connected, via a rotation center shaft thereof, to one face or an opposite face of the cell zig assembly on which the zig for the positive electrode terminal and the zig for the negative electrode terminal are disposed, wherein the zig rotation inducing assembly allows the cell zig assembly to rotate around the rotation center shaft.

In one implementation, the cell zig assembly is configured to rotate by an angle within 180 degrees around the rotation center shaft.

In one implementation, the zig rotation inducing assembly is configured to maintain a state in which the cell zig assembly has rotated by −90 degrees, 0 degree, or +90 degrees around the rotation center shaft.

In one implementation, the universal jig further comprises a zig moving assembly connected to a lower end of the zig rotation inducing assembly to move the zig rotation inducing assembly and the cell zig assembly in one direction and along a horizontal plane parallel to a bottom face of the cell receiving part.

In one implementation, said one direction is parallel to a direction in which the zig for the positive electrode terminal and the zig for the negative electrode terminal are adjacent to each other.

In one implementation, the zig moving assembly includes: a sliding guide member having a length direction parallel to said one direction; and a sliding member disposed on the sliding guide member so as to slide along the length direction of the sliding guide member, wherein the sliding member is connected to a lower end of the zig rotation inducing assembly.

In one implementation, the zig moving assembly further includes a plurality of shock-absorbing springs to prevent collision between the sliding member and the sliding guide member when the sliding member 3 is sliding along the sliding guide member.

In one implementation, the cell zig assembly rotates in a state that the sliding member has moved by a predefined distance along the sliding guide member.

In one implementation, the universal jig further comprises a rotation inducing handle protruding from one face or an opposite face of the cell zig assembly on which the zig for the positive electrode terminal and the zig for the negative electrode terminal are disposed.

In one implementation, the zig for the positive electrode terminal includes a second probe pin, and a wire connector member for a positive electrode connected to the second probe pin, wherein the zig for the negative electrode terminal includes a first probe pin and a wire connector member for a negative electrode connected to the first probe pin, wherein a distal end of each of the wire connector member for the positive electrode and the wire connector member for the negative electrode protrudes in a rearward direction of each of the zig for the positive electrode terminal and the zig for the negative electrode terminal.

In one implementation, the cell receiving part further including a cell constraining member for constraining the secondary battery cell loaded onto the cell receiving part.

In one implementation, the cell receiving part includes a first rail and a second rail spaced apart from each other by a predefined distance, wherein the secondary battery cell is covered with a battery protection member and loaded between the first rail and the second rail, wherein the cell constraining member is disposed on a top face of one of the first rail and the second rail to press the battery protection member to constrain the secondary battery cell.

The universal jig for charging and discharging the secondary battery cell according to one embodiment of the present disclosure may charge and discharge the secondary battery cell in a forward state in which the negative electrode terminal and the positive electrode terminal of the secondary battery cell face upwards, a state in which the secondary battery cell has rotated by +90 degrees, and a state in which the secondary battery cell had rotated by −90 degrees. Thus, the secondary battery cell may rotate by various angles. The secondary battery cell may be oriented vertically or horizontally. Thus, a charge/discharge test may be performed under conditions similar to an environment in which the battery is actually used.

Further, when the operator wants to rotate the secondary battery cell and the cell zig assembly in a state in which the secondary battery cell and the cell zig assembly are accommodated in a chamber for the charge/discharge test of the secondary battery cell, the operator may pull the cell zig assembly via the sliding member of the zig moving assembly to withdraw the cell zig assembly out of the chamber. In this state, the secondary battery cell and the cell zig assembly may rotate. Thus, the secondary battery cell and the cell zig assembly may be easily rotated without securing an additional space necessary for rotating the secondary battery cell and the cell zig assembly in addition to the chamber in which the charge/discharge test is performed.

In addition to the effects as described above, specific effects of the present disclosure will be described together with the detailed description for carrying out the disclosure.

DETAILED DESCRIPTIONS

Figure 1:
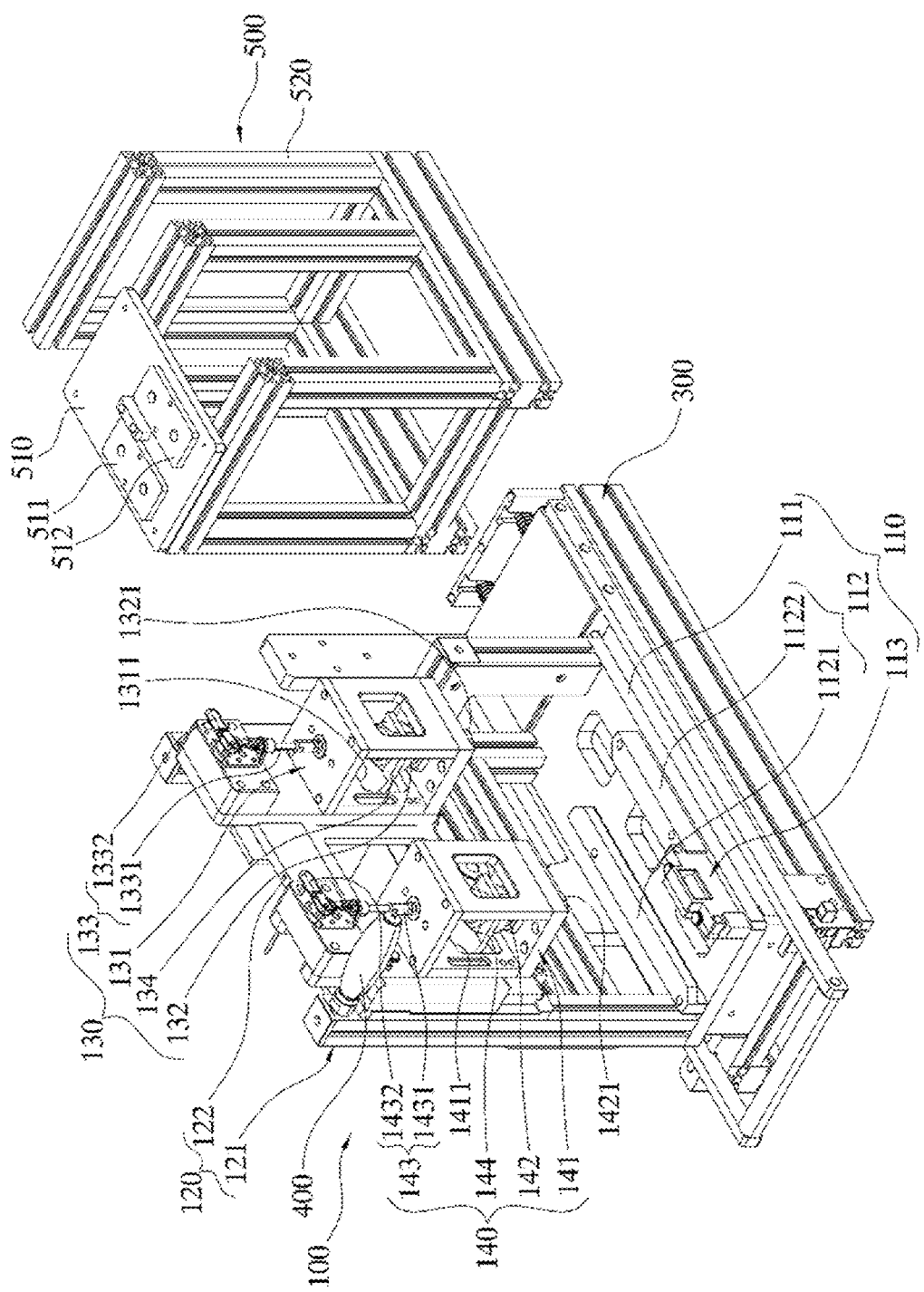
FIG. 1 is a perspective view showing a configuration of a universal jig for charging and discharging a secondary battery cell according to one embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Figure 2:
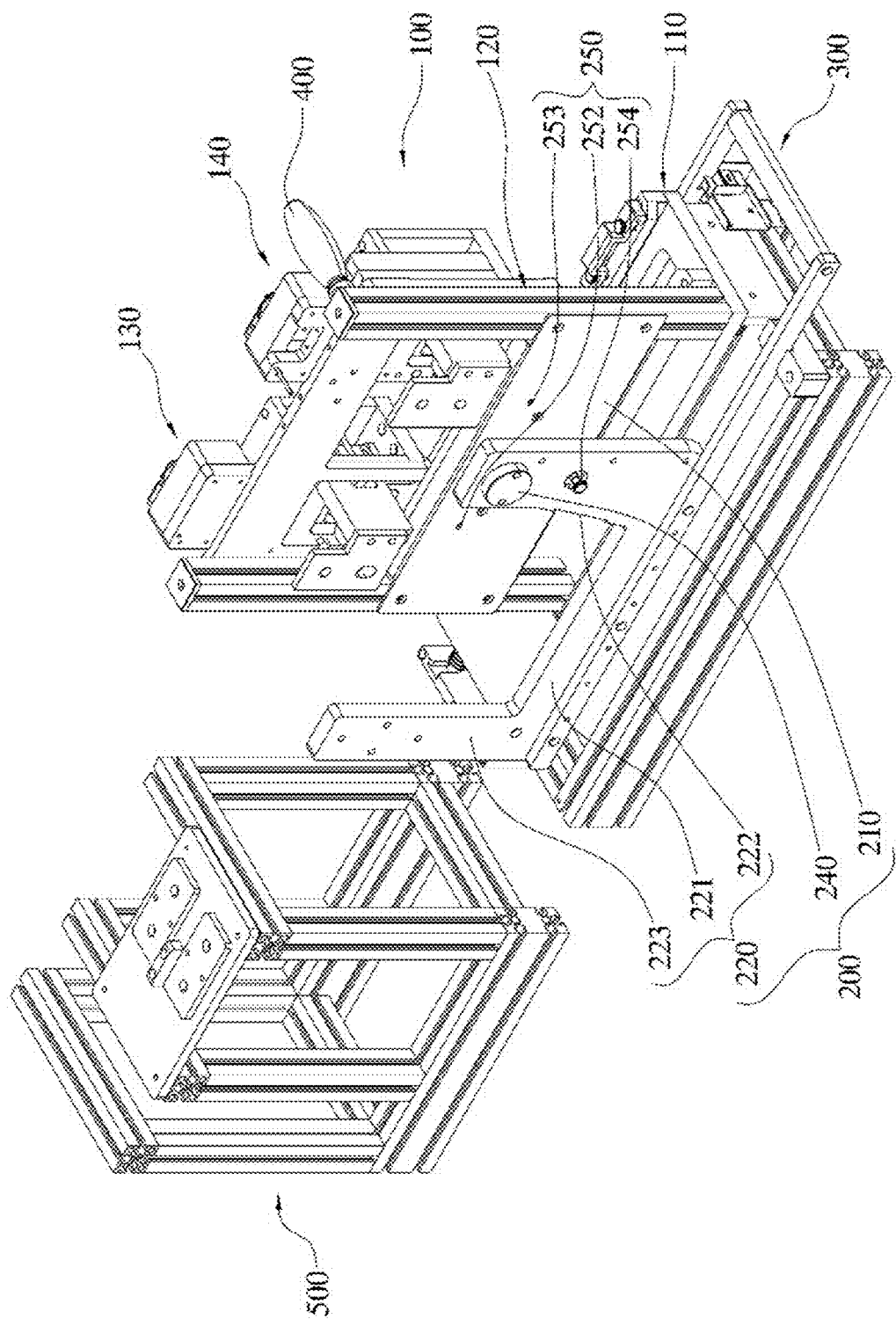
FIG. 2 is a rear perspective view of FIG. 1.
Figure 3:
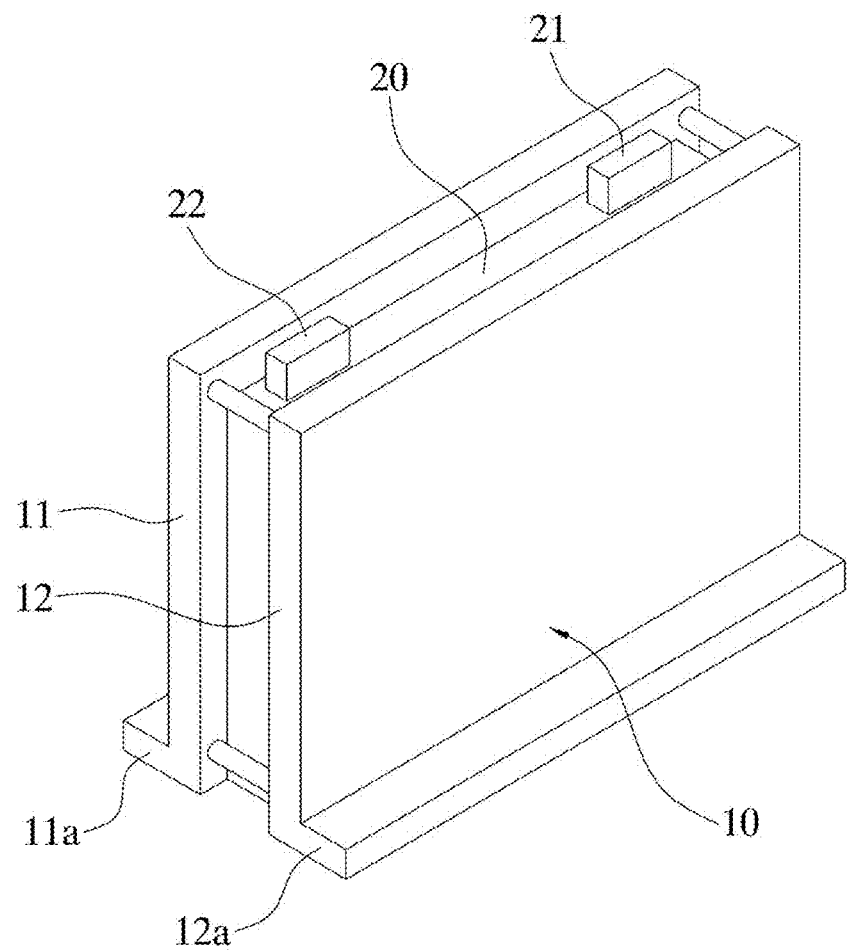
FIG. 3 is a perspective view showing a state in which a secondary battery cell is accommodated in a battery protection member.
Figure 4A:
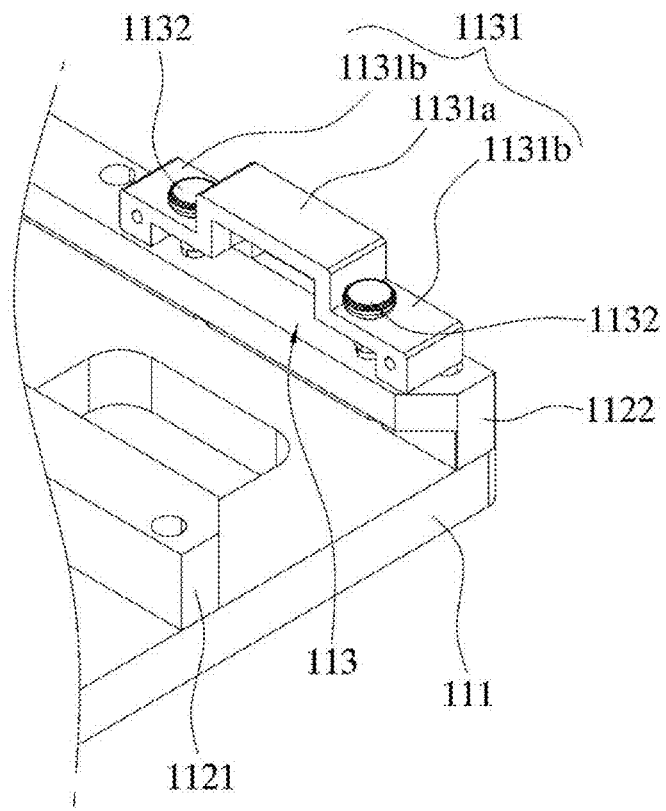
FIG. 4A is a partially enlarged perspective view for describing the cell constraining member shown in FIG. 1.
Figure 4B:
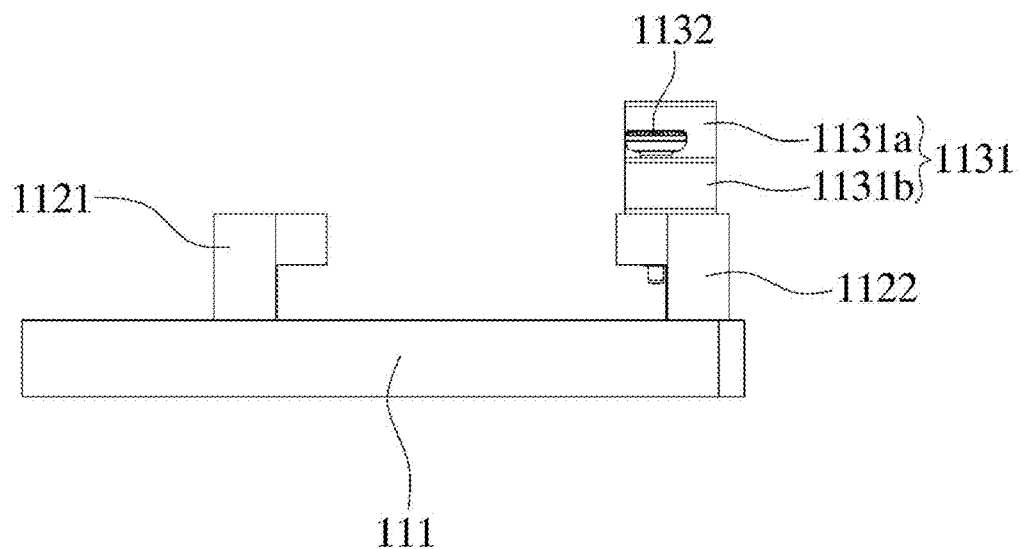
FIG. 4B is a side view of FIG. 4A.
Figure 5:
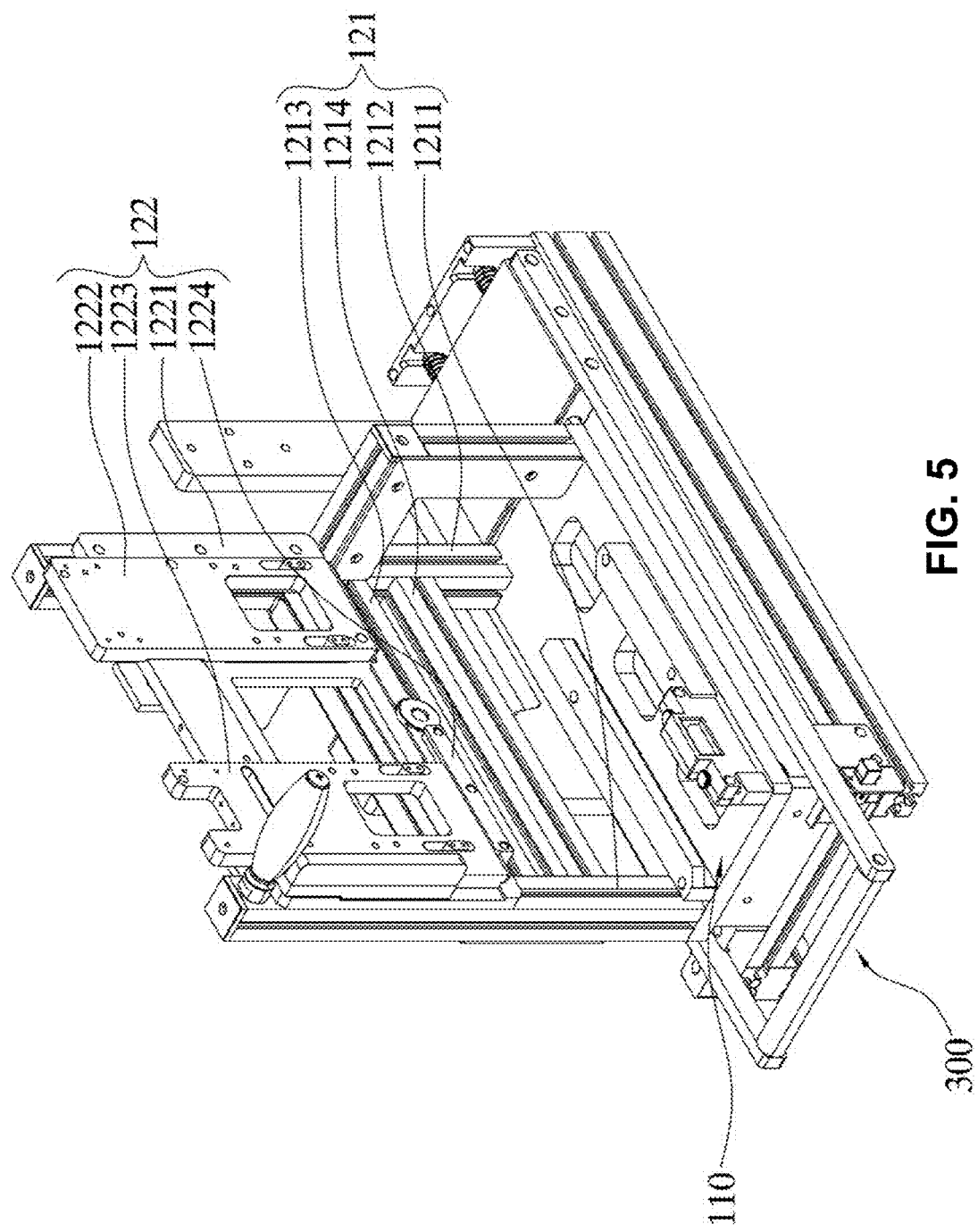
FIG. 5 is a perspective view showing a state in which a zig for a negative electrode terminal and a zig for a positive electrode terminal shown in FIG. 1 are omitted.
Figure 6:
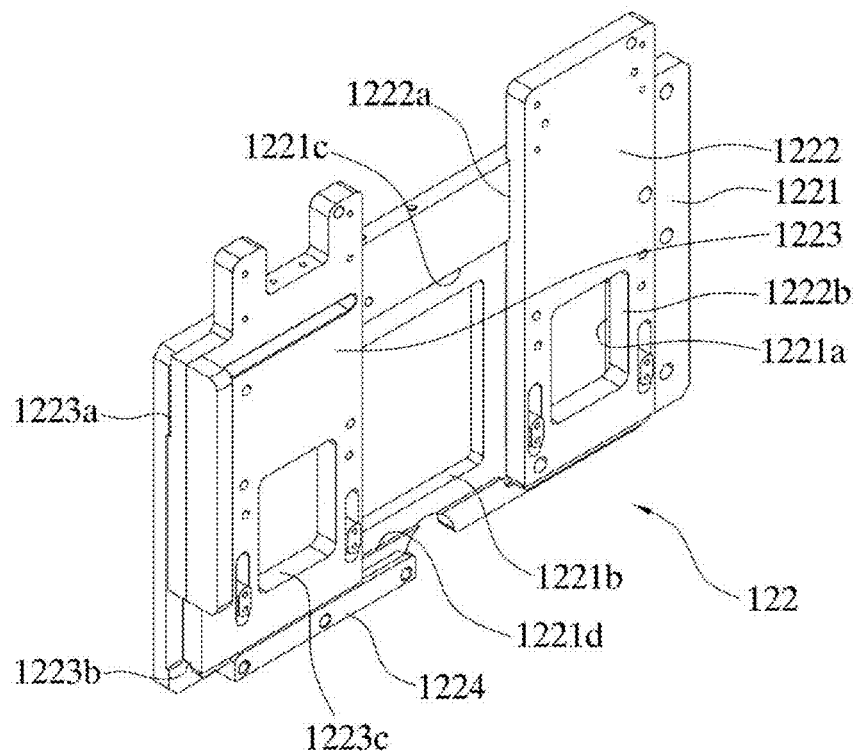
FIG. 6 is an enlarged perspective view of a zig mounted plate shown in FIG. 1.
Figure 7:
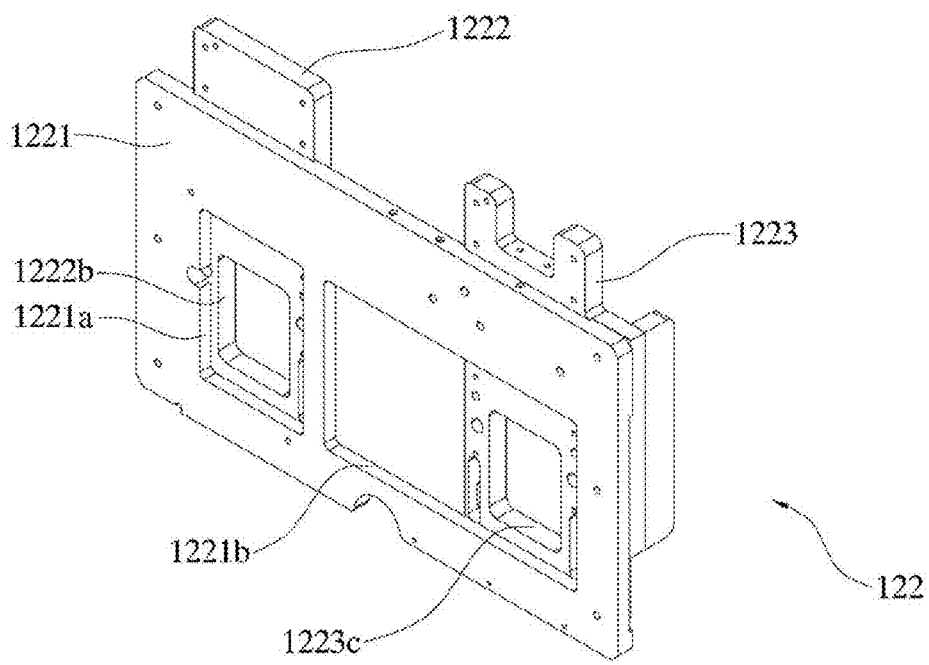
FIG. 7 is a rear perspective view of FIG. 6.
Figure 8:
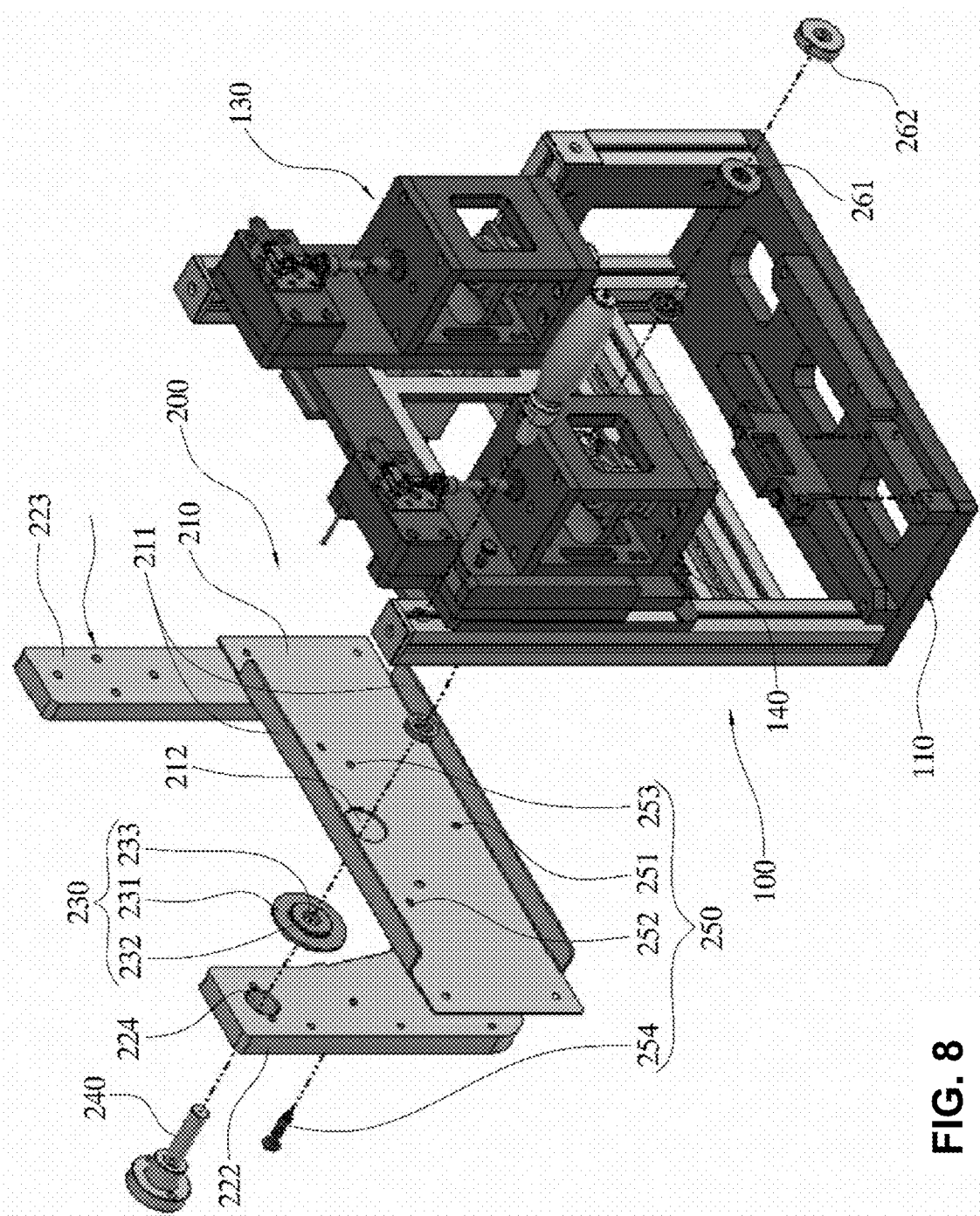
FIG. 8 is a perspective view showing a configuration of a zig rotation inducing assembly shown in FIG. 2.
Figure 9:
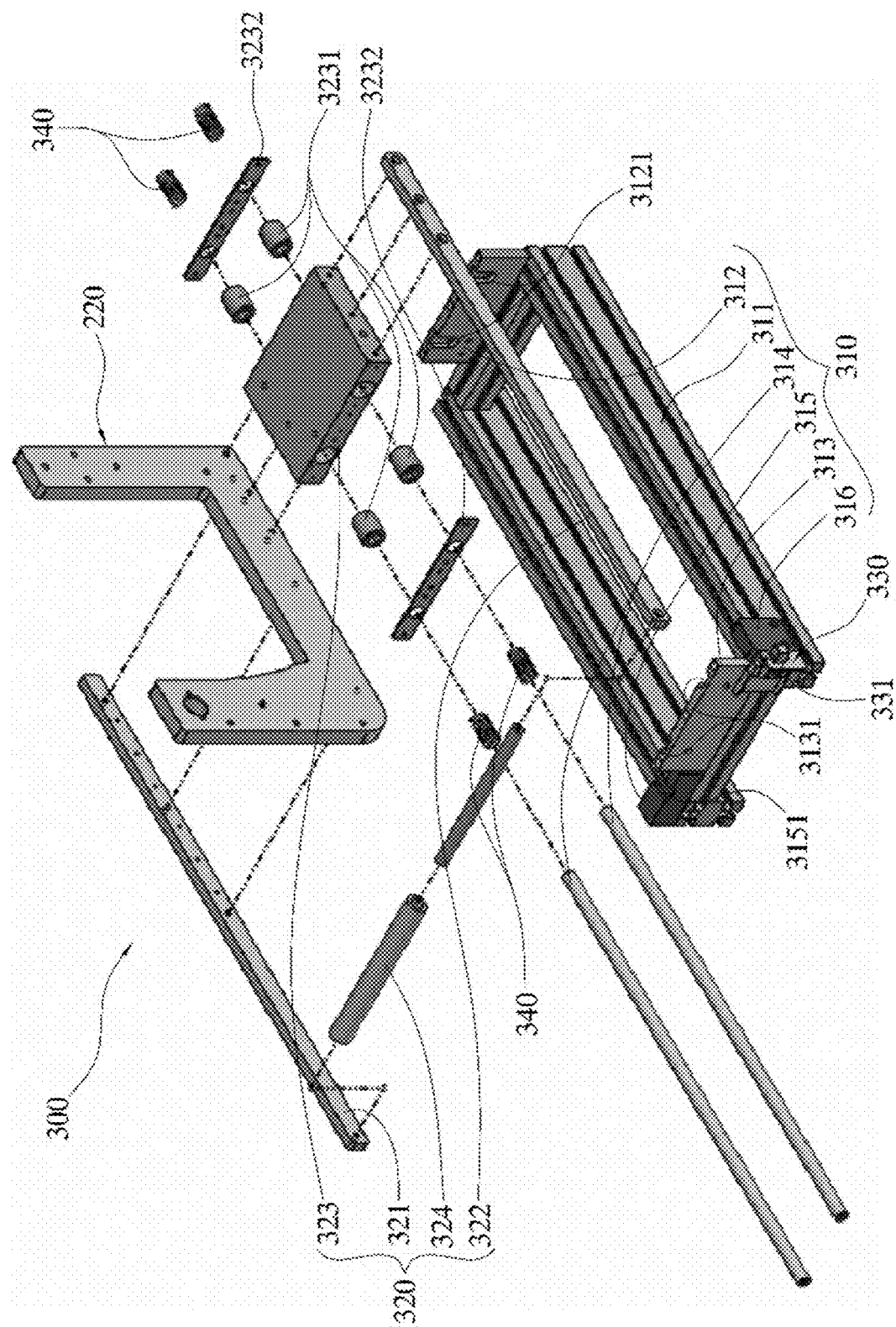
FIG. 9 is an exploded perspective view showing a configuration of a zig moving assembly shown in FIG. 1.
Figure 10:
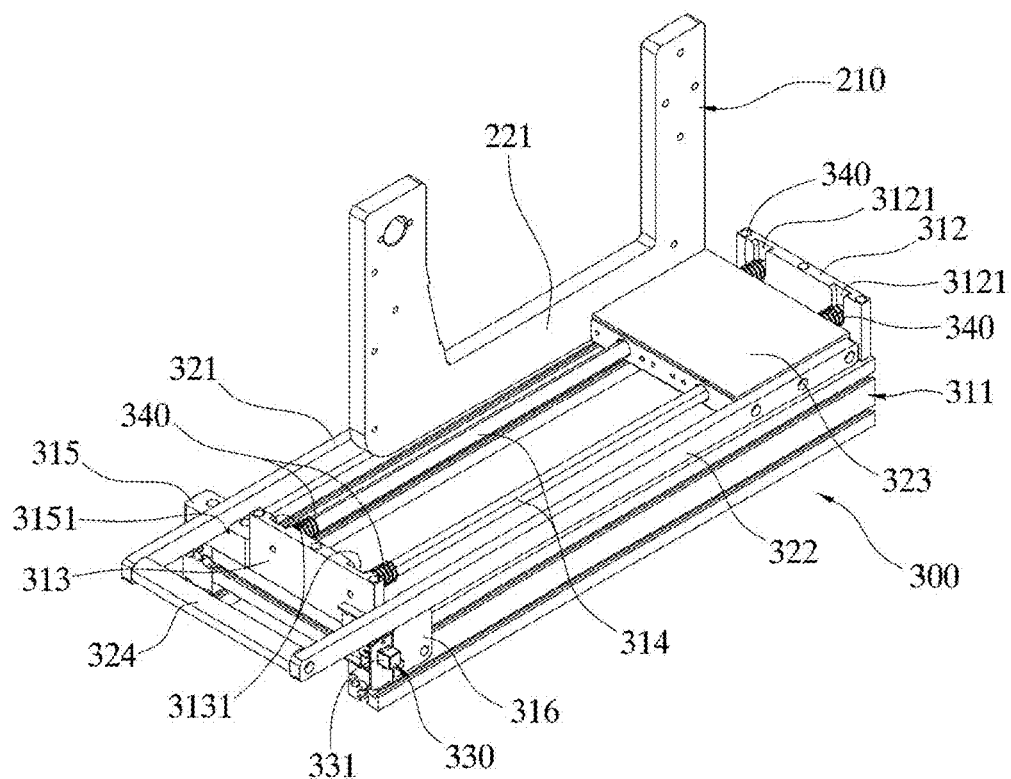
FIG. 10 is a combined perspective view of FIG. 9.
Figure 11:
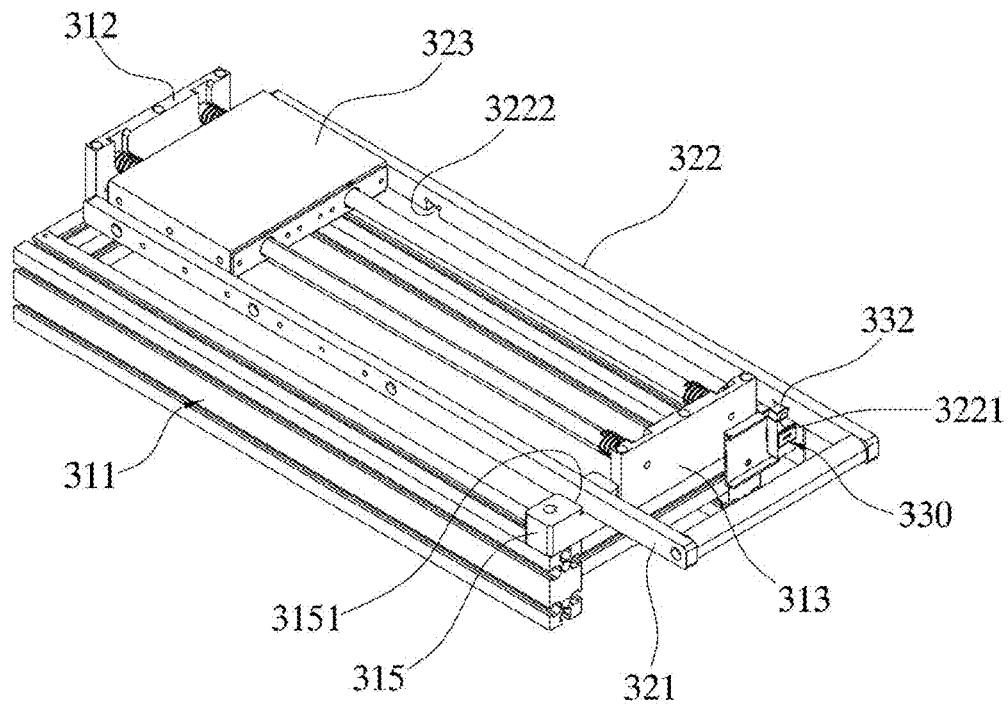
FIG. 11 is a perspective view showing an exterior appearance of a zig moving assembly free of a zig support frame shown in FIG. 10.

FIG. 1 is a perspective view showing a configuration of a universal jig for charging and discharging a secondary battery cell according to one embodiment of the present disclosure. FIG. 2 is a rear perspective view of FIG. 1. FIG. 3 is a perspective view showing a state in which a secondary battery cell is accommodated in a battery protection member. FIG. 4A is a partially enlarged perspective view for describing the cell constraining member shown in FIG. 1. FIG. 4B is a side view of FIG. 4A. FIG. 5 is a perspective view showing a state in which a zig for a negative electrode terminal and a zig for a positive electrode terminal shown in FIG. 1 are omitted. FIG. 6 is an enlarged perspective view of a zig mounted plate shown in FIG. 1. FIG. 7 is a rear perspective view of FIG. 6. FIG. 8 is a perspective view showing a configuration of a zig rotation inducing assembly shown in FIG. 2. FIG. 9 is an exploded perspective view showing a configuration of a zig moving assembly shown in FIG. 1. FIG. 10 is a combined perspective view of FIG. 9. FIG. 11 is a perspective view showing an exterior appearance of a zig moving assembly free of a zig support frame shown in FIG. 10.

Referring to FIG. 1 and FIG. 2, the universal jig for charging and discharging the secondary battery cell according to one embodiment of the present disclosure may include a cell zig assembly 100, a zig rotation inducing assembly 200, a zig moving assembly 300, a rotation inducing handle 400, a wire-related assembly 500.

The cell zig assembly 100 may include a cell receiving part 110, a zig mounted member 120, a zig 140 for a positive electrode terminal and a zig 130 for a negative electrode terminal.

The cell receiving part 110 receives a secondary battery cell thereon. In one example, the cell receiving part 110 may include a base plate 111, a cell mounted rail 112 and a cell constraining member 113.

The base plate 111 may be formed in a rectangular plate shape to constitute a bottom surface of the cell receiving part 110.

The cell mounted rail 112 may be disposed on a top face of the base plate 111 so as to extend in a parallel manner to a longitudinal direction of the base plate 111. In one example, the cell mounted rail 112 may include a first rail 1121, and a second rail 1122 spaced apart from the first rail 1121 by a predetermined distance in a width direction of the base plate 111. For example, a cross-sectional shape of each of the first rail 1121 and the second rail 1122 may be a L-shape.

In this connection, when a secondary battery cell 20 is mounted on the cell mounted rail 112, the secondary battery cell 20 may be disposed in the cell receiving part 110 in a state in which the cell 20 is accommodated in the battery protection member 10 as shown in FIG. 3. The battery protection member 10 includes a first battery cover 11 and a second battery cover 12 respectively covering both opposing sides of the secondary battery cell 20. Each of the battery covers 11 and 12 has each of bottom plates 11a and 12a protruding horizontally and outwardly from a lower end of each of the battery covers 11 and 12. The bottom plates 11a and 12a of the battery covers 11 and 12 may be respectively inserted into the first rail 1121 and the second rail 1122 and may respectively slide along the first rail 1121 and the second rail 1122.

The cell constraining member 113 may constrain the battery protection member 10 and the secondary battery cell 20 so that the secondary battery cell 20 inserted between the first rail 1121 and the second rail 1122 via the battery protection member 10 is not easily removed from the cell receiving part 110.

Referring to FIG. 4A and FIG. 4B, in one example, the cell constraining member 113 may include a pulling button 1131 and a pair of cell constraining pins 1132.

The pulling button 1131 may be disposed on one of the first rail 1121 and the second rail 1122, for example, on a top face of the second rail 1122. The pulling button 1131 may include a pulling handle 1131a protruding from the top face of the second rail 1122, a pair of pin fasteners 1131b respectively extending from both opposing sides of the pulling handle 1131a horizontally, and a pair of cell constraining pins 1132 respectively passing through the pin fasteners 1131b and a top face of the second rail 1122, so that a distal end of each of the pair of cell constraining pins 1132 is inserted into the second rail 1122.

A vertical level of the distal end of each of the pair of cell constraining pins 1132 inserted into the second rail 1122 is lower than a vertical level of a top face of the bottom plate 12a of the second battery cover 12 of the battery protection member 10 inserted into the second rail 1122 such that the distal blocks an entrance of the second rail and blocks an end of the bottom plate so that the battery protection member 10 and the secondary battery cell 20 are not removed from the first rail 1121 and the second rail 1122. In one example, each of the pair of cell constraining pins 1132 may be embodied as a quick release pin that are detachable or attachable from and to each of the pin fasteners 1132b via one touch.

Therefore, when the pulling button 1131 has been pulled upwards, the distal end of each of the pair of cell constraining pins 1132 has been pulled upwardly toward the top face of the second rail 1122, and has been positioned above the top face of the bottom plate 12a of the second battery cover 12. Conversely, when the upwardly pulled pulling button 1131 is released, the pair of cell constraining pins 1132 are again inserted into the second rail 1122 so that the distal ends may block the entrance of the second rail 1122 and block the end of the bottom plate 12a.

The cell constraining member 113 prevents the secondary battery cell 20 and the battery protection member 10 from being removed from the first rail 1121 and the second rail 1122 due to their own weights when the cell zig assembly 100 is rotated by the zig rotation inducing assembly 200 to be described later.

The zig mounted member 120 of the cell zig assembly 100 constitutes one face on which a zig 140 for a positive electrode terminal and a zig 130 for a negative electrode terminal are mounted. The zig mounted member 120 may be connected to one of two ends in the longitudinal direction of the base plate 111 of the cell receiving part 110 and may extend in a normal manner to the bottom plates 11a and 12a.

Referring to FIG. 5, in one example, the zig mounted member 120 may include a zig mounted frame 121 and a zig mounted plate 122. The zig mounted frame 121 may include a first vertical frame 1211 and a second vertical frame 1212 respectively disposed on both opposing sides in the longitudinal direction of each of the bottom plates 11a and 12a, and a first horizontal frame 1213 and a second horizontal frame 1214 horizontally extending between and connected to the first vertical frame 1211 and the second vertical frame 1212, and spaced apart from each other by a predetermined distance in a height direction of the first vertical frame 1211 and the second vertical frame 1212. In one example, the first horizontal frame 1213 may be positioned above the second horizontal frame 1214.

Referring to FIG. 6 and FIG. 7, the zig mounted plate 122 may include a base plate 1221, a first zig mounted plate 1222, and second zig mounted plate 1223. The base plate 1221 may include a first rectangular opening 1221a defined in one side portion of the base plate, a second rectangular opening 1221b that is adjacent to the first rectangular opening 1221a and has a horizontal length larger than that of the first rectangular opening 1221a, a first stepped portion 1221c formed above the first rectangular opening 1221a and the second rectangular opening 1221b, and a second stepped portion 1221d formed below the first rectangular opening 1221a and the second rectangular opening 1221b.

The first zig mounted plate 1222 may be coupled to a front face of the base plate 1221 so as to face toward the first rectangular opening 1221a. A first support groove 1222a supported on the first stepped portion 1221c may be defined in a rear face of the first zig mounted plate 1222. Thus, a lower end of the first zig mounted plate 1222 may be supported on the second stepped portion 1221d. In addition, a third rectangular opening 1222b may pass through the first zig mounted plate 1222 and face toward the first rectangular opening 1221a.

The second zig mounted plate 1223 may be coupled to a front face of the base plate 1221 so as to face toward the second rectangular opening 1221b. A second support groove 1223a supported on the first stepped portion 1221c and a third support groove 1223b supported on the second stepped portion 1221d may be defined in a rear face of the second zig mounted plate 1223. In addition, a fourth rectangular opening 1223c may pass through the second zig mounted plate 1223 and face toward the second rectangular opening 1221b.

Further, the second zig mounted plate 1223 may be constructed to be slide so as to be closer to or away from the first zig mounted plate 1222. To this end, a guide bar 1224 may be disposed on a front face of the base plate 1221 so as to face toward the first stepped portion 1221c. The first support groove 1222a of the second zig mounted plate 1223 may be supported on the first stepped portion 1221c. A lower end of the second zig mounted plate 1223 may be inserted between the guide bar 1224 and the front face of the base plate 1221 so that the second zig mounted plate 1223 may slide.

The zig 130 for the negative electrode terminal may include a first pin mounted block 131, a first probe pin 132, a first toggle clamp 133, and a wire connector member 134 for the negative electrode.

The first pin mounted block 131 may have a rectangular parallelepiped shape and have a fifth rectangular opening 1311 defined in a rear face thereof, and may be constructed to move vertically on and along the first zig mounted plate 1222. The fifth rectangular opening 1311 corresponds to the third rectangular opening 1222b.

The first probe pin 132 may be accommodated in the first pin mounted block 131 such that a first head 1321 thereof in contact with a negative electrode terminal 21 of the secondary battery cell 20 protrudes from a bottom of the first pin mounted block 131.

The first toggle clamp 133 may be disposed on the first zig mounted plate 1222 so as to be disposed above the first pin mounted block 131. The clamp 133 may include a first movable shaft 1331 connected to a top face of the first pin mounted block 131, and a first lever 1332 that pushes or pulls an upper end of the first movable shaft 1331 to reciprocate up and down the first movable shaft 1331. An operator may rotate the first lever 1332 of the first toggle clamp 133 in a left or right direction such that the first pin mounted block 131 may move up and down. Accordingly, the first head 1321 of the first probe pin 132 may be spaced apart from or in contact with the positive electrode terminal 22 of the secondary battery cell 20.

The wire connector member 134 for the negative electrode may be connected to the first probe pin 132. A distal end of the member 134 may protrude in a rearward direction of the zig 130 for the negative electrode terminal. That is, one end of the member 134 may be connected to the first probe pin 132, and the opposite end thereof may protrude in the rearward direction of the zig 130 for the negative electrode terminal. In this connection, the distal end of the wire connector member 134 for the negative electrode may pass through the fifth rectangular opening 1311 of the first pin mounted block 131, the third rectangular opening 1222b of the first zig mounted plate 1222, and the first rectangular opening 1221a of the base plate 1221 and then may protrude in the rearward direction of the zig 130 for the negative electrode terminal. The wire connector member 134 for the negative electrode may be formed in a form of a bus bar.

The zig 140 for the positive electrode terminal may include a second pin mounted block 141, a second probe pin 142, a second toggle clamp 143, and a wire connector member 144 for the positive electrode.

The second pin mounted block 141 may be formed in a rectangular parallelepiped shape and may have a sixth rectangular opening 1411 defined in a rear face thereof. The block 141 may be disposed on the second zig mounted plate 1223 so as to move up and down. The sixth rectangular opening 1411 corresponds to the fourth rectangular opening 1223c.

The second probe pin 142 may be accommodated in the second pin mounted block 141 such that a second head 142 thereof in contact with a positive electrode terminal 22 of the secondary battery cell 20 protrudes from a bottom of the second pin mounted block 141.

The second toggle clamp 143 may be disposed on the second zig mounted plate 1223 so as to be disposed above the second pin mounted block 141. The clamp 143 may include a second movable shaft 1431 connected to the top face of the second pin mounted block 141 and a second lever 1432 which may push or pull an upper end of the second movable shaft 1431 to reciprocate up and down the second movable shaft 1431. The operator may rotate the second lever 1432 of the second toggle clamp 143 in a left or right direction to move the second pin mounted block 141 up and down. Accordingly, the second head 1421 of the second probe pin 142 may be spaced apart from or in contact with the positive electrode terminal 22 of the secondary battery cell 20.

The wire connector member 144 for the positive electrode may be connected to the second probe pin 142. A distal end of the member 144 may protrude in a rearward direction of the zig 140 for the positive electrode terminal. That is, one end of the member 144 may be connected to the second probe pin 142 and the opposite end thereof may protrude in the rearward direction of the zig 140 for the positive electrode terminal. In this connection, the distal end of the wire connector member 144 for the positive electrode may pass through the sixth rectangular opening 1411 of the second pin mounted block 141, the third rectangular opening 1222b of the second zig mounted plate 1223, and the second rectangular opening of the base plate 1221, and then may protrude in the rearward of the zig 140 for the positive electrode terminal through 1221b. The wire connector member 144 for the positive electrode may be formed in a form of a bus bar.

Because the zig 140 for the positive electrode terminal is mounted on the second zig mounted plate 1223, horizontal movement of the zig 140 may be executed according to the horizontal movement of the second zig mounted plate 1223. The zig 140 may move horizontally by a displacement according to a size of the secondary battery cell 20 loaded onto the cell receiving part 110. Thus, the zig 140 may be positioned above positive electrode terminals 22 of secondary battery cells 20 of different sizes.

The zig rotation inducing assembly 200 may be connected to one face or the opposite face of the assembly 100 on which the zig 140 for the positive electrode terminal and the zig 130 for the negative electrode terminal are disposed, via a rotation center shaft 240 thereof. The zig rotation inducing assembly 200 may allow the cell zig assembly 100 to rotate around the rotation center shaft 240.

Referring to FIG. 8, in one example, the zig rotation inducing assembly 200 may include a rotatable plate 210, a zig support frame 220, a rotatable spacer 230, the rotation center shaft 240, and constraining means 250.

The rotatable plate 210 may be coupled to one face of the cell zig assembly 100, that is, the zig mounted frame 121 of the cell zig assembly 100. To this end, the rotatable plate 210 may have a shape of a rectangular plate having a length such that the plate 210 may cover a portion of a rear face of each of the first vertical frame 1211 and the second vertical frame 1212 of the zig mounted frame 121, and a width corresponding to a distance between an upper end of the first horizontal frame 1213 and a lower end of the second horizontal frame 1214. The rotatable plate 210 may include two bent portions 211 facing toward each other and bent from both ends extending in a parallel manner to a longitudinal direction thereof. In this case, the plate 210 may cover the first horizontal frame 1213 and the second horizontal frame 1214 while each of the two bent portions 211 supports each of the upper end of the first horizontal frame 1213 and the lower end of the second horizontal frame 1214. Then, each of both opposing sides of the plate 210 in the longitudinal direction may be fixed to each of the first vertical frame 1211 and the second vertical frame 1212. The plate 210 may be coupled to a rear face of the zig mounted frame 121, that is, the opposite face to one face of the assembly 100 on which the side where zig 140 for the positive electrode terminal and zig 130 for the negative electrode terminal are disposed.

The zig support frame 220 supports the cell zig assembly 100 so that the cell zig assembly 100 is in a floated state in an air. In one example, the zig support frame 220 may be formed in a U shape, and may include a horizontal support portion 221, a first vertical support portion 222 extending vertically from one end of the horizontal support portion 221, for example, a left end of the horizontal support portion 221, and a second vertical support portion 223 extending vertically from the other end of the horizontal support portion 221, for example, a right end of the horizontal support portion 221. A shaft receiving hole 224 through which the rotation center shaft 240 passes may be formed in one of the first vertical support portion 222 and the second vertical support portion 223. For example, the shaft receiving hole 224 may be formed in the first vertical support portion 222.

In this connection, a vertical dimension=from a lower end of the horizontal support portion 221 to an upper end of each of the first vertical support portion 222 and the second vertical support portion 223 is larger than a distance between a point where the rotation center shaft 240 which will be described later passes through the first horizontal frame 1213 of the zig mounted frame 121 and a bottom face of the base plate 111 of the cell receiving part 110.

The rotatable spacer 230 may be coupled to the rotatable plate 210 so as to be disposed on a rear face of the rotatable plate 210. When the rotatable plate 210 rotates around the rotation center shaft 240, the spacer 230 may maintain a spacing between the zig support frame 220 and the rotatable plate 210 so that the rotatable plate 210 may rotate easily without friction with the zig support frame 220.

In one example, the rotatable spacer 230 may include a circular plate-shaped spacing maintaining portion 231, a rotatable plate coupling portion 232 protruding from one face of the spacing maintaining portion 231 and having a circular shape, and a shaft passing-through hole 233 passing through a center of the spacing maintaining portion 231 and a center of the rotatable plate coupling portion 232. A bearing may be inserted into the shaft passing-through hole 233, and the rotation center shaft 240 may be inserted into the bearing.

The rotatable spacer 230 may be coupled to the rotatable plate 210 at the rear face of the rotatable plate 210. To this end, the rotatable plate 210 may have a spacer receiving hole 212 defined in a center of an upper portion thereof into which the rotatable plate coupling portion 232 of the rotatable spacer 230 is inserted. When the rotatable plate coupling portion 232 is inserted into the spacer receiving hole 212, the rotatable spacer 230 may be disposed in a center of the rear face of the rotatable plate 210.

The rotation center shaft 240 may connect the cell zig assembly 100 to the zig rotation inducing assembly 200 and acts as a center of rotation of the cell zig assembly 100 and the rotatable plate 210. The rotation center shaft 240 may have a length such that the shaft 240 may extend from the zig support frame 220 and pass through the first horizontal frame 1213 of the zig mounted frame 121 and protrude outwardly.

The rotation center shaft 240 may sequentially pass through the shaft receiving hole 224 of the first vertical support portion 222 of the zig support frame 220, the rotatable spacer 230, and the first horizontal frame 1213 of the zig mounted frame 121 so that a distal end of the shaft 240 may protrude outwardly of the first horizontal frame 1213. A washer 261 and a shaft fixing ring 262 supported on the first horizontal frame 1213 may be coupled to the protruding distal end of the shaft 240 so that the rotation center shaft 240 is not removed from the first horizontal frame 1213.

The cell zig assembly 100 may rotate around the rotation center shaft 240 based on a coupling structure between the rotatable spacer 230 and the rotation center shaft 240. In this connection, the cell zig assembly 100 may rotate within a radius of 180 degrees around the rotation center shaft 240. In one example, the cell zig assembly 100 may rotate clockwise and counterclockwise by 0 degrees, −90 degrees, and +90 degrees around the rotation center shaft 240.

The constraining means 250 fixes the rotated state of the rotatable plate 210 and the cell zig assembly 100. The constraining means 250 may include constraining holes 251, 252, and 253 and a constraining pin 254.

A plurality of constraining holes 251, 252, and 253 may be arranged around the shaft receiving hole 224 in the rotatable plate 210. In one example, the constraining holes 251, 252, and 253 may include a first constraining holes 251 located below the shaft receiving hole 224, a second constraining hole 252 displaced by +90 degrees from the first constraining hole 251 and spaced apart from the rotation center shaft 240 by a distance equal to a distance between the rotation center shaft 240 and the first constraining hole 251, and a third constraining hole 253 displaced by −90 degrees from the first constraining hole 251 and spaced apart from the rotation center shaft 240 by a distance equal to a distance between the rotation center shaft 240 and the first constraining hole 251.

In this connection, the first constraining hole 251 may act to fix a state in which the rotatable plate 210 and the cell zig assembly 100 have a rotation angle of 0, that is, a forward state. The second constraining hole 252 may act to fix a state in which the rotatable plate 210 and the cell zig assembly 100 have rotated by +90 degrees. The third constraining hole 253 may act to fix a state in which the rotatable plate 210 and the cell zig assembly 100 have rotated by −90 degrees.

The constraining pin 254 may be coupled to and pass through the first vertical support portion 222 of the zig support frame 220 to which the rotation center shaft 240 is coupled. A distal end of the pin 254 may be selectively inserted into the first to third constraining holes 251 to 253. That is, normally, the distal end of the constraining pin 254 may be inserted into the first constraining hole 251 to fix the state in which the rotatable plate 210 and the cell zig assembly 100 have the zero rotation amount. When the rotatable plate 210 and the cell zig assembly 100 have rotated by +90 degrees, the distal end of the pin 254 is inserted into the second constraining hole 252 to constrain the rotated rotatable plate 210 and the cell zig assembly 100. When the rotatable plate 210 and the cell zig assembly 100 have rotated by −90 degrees, the distal end of the pin 254 is inserted into the third constraining hole 253 to constrain the rotated rotatable plate 210 and the cell zig assembly 100.

In one example, the constraining pin 254 may be configured as a quick release pin which may be detachable from or attachable to the holes 251 to 253 via one touch.

The zig moving assembly 300 may be connected to a lower end of the zig rotation inducing assembly 200 to move the zig rotation inducing assembly 200 and the cell zig assembly 100 along a horizontal plane parallel to a bottom face of the cell receiving part 110 in one direction. This one direction may be a direction parallel to a direction in which the zig 140 for the positive electrode terminal and the zig 130 for the negative electrode terminal are spaced from each other.

Referring to FIG. 9 and FIG. 10, in one example, the zig moving assembly 300 may include a sliding guide member 310, a sliding member 320, a plurality of shock-absorbing springs 340, and a stopper 330.

The sliding guide member 310 may include a base frame 311, a first shaft holder 312 and a second shaft holder 313, a plurality of guide shafts 314, a first guide block 316, and a second guide block 316.

The base frame 311 may be a rectangular frame. A longitudinal direction of the frame 311 may be parallel to a direction in which the zig 140 for the positive electrode terminal and zig 130 for the negative electrode terminal are spaced from each other.

The first shaft holder 312 and the second shaft holder 313 may be respectively disposed at both opposing ends of the base frame 311 in the longitudinal direction thereof. In one example, each of the first shaft holder 312 and the second shaft holder 313 may have a rectangular plate shape. In a plan view of the base frame 311, the first shaft holder 312 may be disposed on a right side of the base frame 311, and the second shaft holder 313 may be disposed on a left side of the base frame 311. In this connection, one long side of each of the first shaft holder 312 and the second shaft holder 313 may be disposed on the base frame 311 such that each the first shaft holder 312 and the second shaft holder 313 may stand upright. A plurality of shaft support grooves 3121 and 3131 in and on which the plurality of guide shafts 314 are inserted and supported may be formed on each of inner faces of the first shaft holder 312 and the second shaft holder 313 facing toward each other.

The number of the plurality of guide shafts 314 may be two. The plurality of guide shafts 314 may be coupled to and extend between the first shaft holder 312 and the second shaft holder 313. In this connection, both opposing ends of each guide shaft 314 may be inserted into and supported on the shaft support grooves 3121 and 3131 of the first shaft holder 312 and the shaft support grooves 3121 and 3131 of the second shaft holder 313, respectively.

Each of the first guide block 316 and the second guide block 316 may be disposed at one end of the base frame 311 in the longitudinal direction. For example, each of the first guide block 316 and the second guide block 316 may be disposed adjacent to the second shaft holder 313.

In one example, the first guide block 316 may be disposed on a short side face of the base frame 311 and at a left side at which the second shaft holder 313 is positioned. A level of a top face of the block 316 is higher than that of a top face of the base frame 311. The second guide block 316 may be coupled to a long side face of the base frame 311.

The sliding member 320 may include a first zig pulling bar 321 and a second zig pulling bar 322, a sliding plate 323, and a pulling handle 324.

Each of the first zig pulling bar 321 and the second zig pulling bar 322 may have a length larger than a length of the base plate 111 of the cell receiving part 110 of the cell zig assembly 100. The first zig pulling bar 321 and the second zig pulling bar 322 may disposed on the base frame 311 so as to face toward each other. In this connection, the first zig pulling bar 321 and the second zig pulling bar 322 may be spaced apart from each other by a spacing greater than a width of the base plate 111.

A lower end of the horizontal support portion 221 of the zig support frame 220 may be coupled to an inner face of one of the first zig pulling bar 321 and the second zig pulling bar 322, for example, the first zig pulling bar 321. Thus, the zig support frame 220 may be accommodated within a space between the first zig pulling bar 321 and the second zig pulling bar 322. Accordingly, the cell zig assembly 100 connected to the zig support frame 220 through the rotation center shaft 240 may be accommodated within the space between the first zig pulling bar 321 and the second zig pulling bar 322 and may be disposed above the first zig pulling bar 321 and the second zig pulling bar 322.

In one example, a first stopper engaged groove 3221 and a second stopper engaged groove 3222 may be formed in an inner face of a zig pulling bar not connected to the zig support frame 220 among the first zig pulling bar 321 and the second zig pulling bar 322, for example, the second zig pulling bar as shown in FIG. 9.

The first stopper engaged groove 3221 and the second stopper engaged groove 3222 may be spaced apart from each other by a predetermined distance. For example, the first stopper engaged groove 3221 may be formed in a position closer to the pulling handle 324 to maintain a state in which the sliding plate 323 to be described later and coupled to and disposed between the first zig pulling bar 321 and the second zig pulling bar 322 has moved closer to the shaft holder 312. The second stopper engaged groove 3222 may be formed at a position closer to the sliding plate 323 to be described later and coupled to and disposed between the first zig pulling bar 321 and the second zig pulling bar 322 to maintain a state in which the sliding plate 323 has moved closer to the second shaft holder 313.

The sliding plate 323 may be disposed between the first zig pulling bar 321 and the second zig pulling bar 322 and may be slidably coupled to the plurality of guide shafts 314. In this connection, the sliding plate 323 may be coupled to and disposed between the horizontal support portion 221 of the zig support frame 220 and one zig pulling bar 321 facing toward the horizontal support portion 221.

In order for the sliding plate 323 to be slidable, a linear bearing 3231 may be inserted into each of side faces of the sliding plate 323 through which the plurality of guide shafts 314 pass. Thus, the linear bearings 3231 may be coupled to each of the plurality of guide shaft 314. A plate-shaped bearing holder 3232 may cover each of the side faces into which the linear bearing 3231 is inserted, so that the linear bearing 3231 may be prevented from being removed from the sliding plate 323.

The pulling handle 324 may be coupled to and disposed between the first zig pulling bar 321 and the second zig pulling bar 322 and may be disposed on the opposite side of the sliding plate 323, and may act as a handle for pulling the first zig pulling bar 321 and the second zig pulling bar 322.

In one example, the first zig pulling bar 321 and the second zig pulling bar 322 may be respectively supported on top faces of the first guide block 316 and the second guide block 316 while the sliding plate 323 is coupled to the plurality of guide shafts 314. Thus, the sliding member 320 has may be stably disposed above the base frame 311. In this connection, the first zig pulling bar 321 may be supported on the top face of the first guide block 316 and the second zig pulling bar 322 may be supported on the top face of the second guide block 316.

In order for the first zig pulling bar 321 and the second zig pulling bar 322 to move easily, that is, to move stably without shaking, a width of a top face of the first guide block 316 may correspond to a thickness of the first zig pulling bar 321. A guide groove 3151 into which a lower end of the first zig pulling bar 321 is inserted may be formed in the first guide block 316. A top face of the second guide block 316 may be flush with a bottom face of the guide groove 3151 such that the second guide block 316 may stably support the second zig pulling bar 322 at the same vertical level as that of the first zig pulling bar 321.

The stopper 330 may maintain a state in which the first zig pulling bar 321 and the second zig pulling bar 322, and the sliding plate 323 have moved. To this end, the stopper 330 may be coupled to the base frame 311 so as to be adjacent to the second guide block 316, and may include a button 331 and an engaged pin 332 that moves vertically using the button 331. The engaged pin 332 may be fastened to a first stopper engaged groove 3221 in a state in which the sliding plate 323 has moved closer to the first shaft holder 312. The engaged pin 332 may be fastened to a second stopper engaged groove 3222 in a state which the sliding plate 323 has moved closer to the second shaft holder 313.

The rotation inducing handle 400 may protrude from one face or the opposite face thereto of the assembly 100 on which the zig 140 for the positive electrode terminal and zig 130 for the negative electrode terminal of the cell zig assembly 100 are disposed. In one example, the rotation inducing handle 400 may be disposed on the first vertical frame 1211 or the second vertical frame 1212 of the zig mounted frame 121 of the zig mounted member 120 of the cell zig assembly 100. For example, the rotation inducing handle 400 may be coupled to an upper portion of the first horizontal frame 1213.

The wire-related assembly 500 may include a wire plate 510 having a positive electrode terminal 511 for a wire and a negative electrode terminal 512 for the wire disposed thereon, and a support body 520 for supporting the wire plate 510.

The positive electrode terminal 511 for the wire may be electrically connected to the wire connector member 144 for the positive electrode of the zig 140 for the positive electrode terminal via a general cable coated with synthetic resin, a bus bar, a silicon cable, etc. The negative electrode terminal 512 for the wire may be electrically connected to the wire connector member 134 for the negative electrode of the zig 130 for the negative electrode terminal via a cable or a bus bar. Further, the positive electrode terminal 511 for the wire and the negative electrode terminal 512 for the wire may be electrically connected to a power supply (not shown) in a formation system or a battery cycler system.

The support body 520 has a certain height. The wire plate 510 may be disposed on an upper end of the body 520. Alternatively, the height of the support body 520 may be adjustable.

In one example, the zig moving assembly 300 may further include a plurality of shock-absorbing springs 340 that prevent collision between the sliding member 320 and the sliding member 310 when the sliding member 320 is sliding along the sliding guide member 310.

The number of the plurality of shock-absorbing springs 340 may be four. Each of the two shock-absorbing springs 340 may be coupled to one side of each of the plurality of guide shaft 314, for example, adjacent to the first shaft holder 312, and may be disposed between the first shaft holder 312 and the sliding plate 323. Each of the remaining two shock-absorbing springs 340 may be coupled to the other side of each of the plurality of guide shafts 314, for example, adjacent to the second shaft holder 313 and disposed between the second shaft holder 313 and the sliding plate 323.

The plurality of shock-absorbing springs 340 may prevent collision of the sliding plate 323 with the first shaft holder 312 and the second shaft holder 313 when the sliding plate 323 is moving along the plurality of guide shafts 314.

Figure 13:
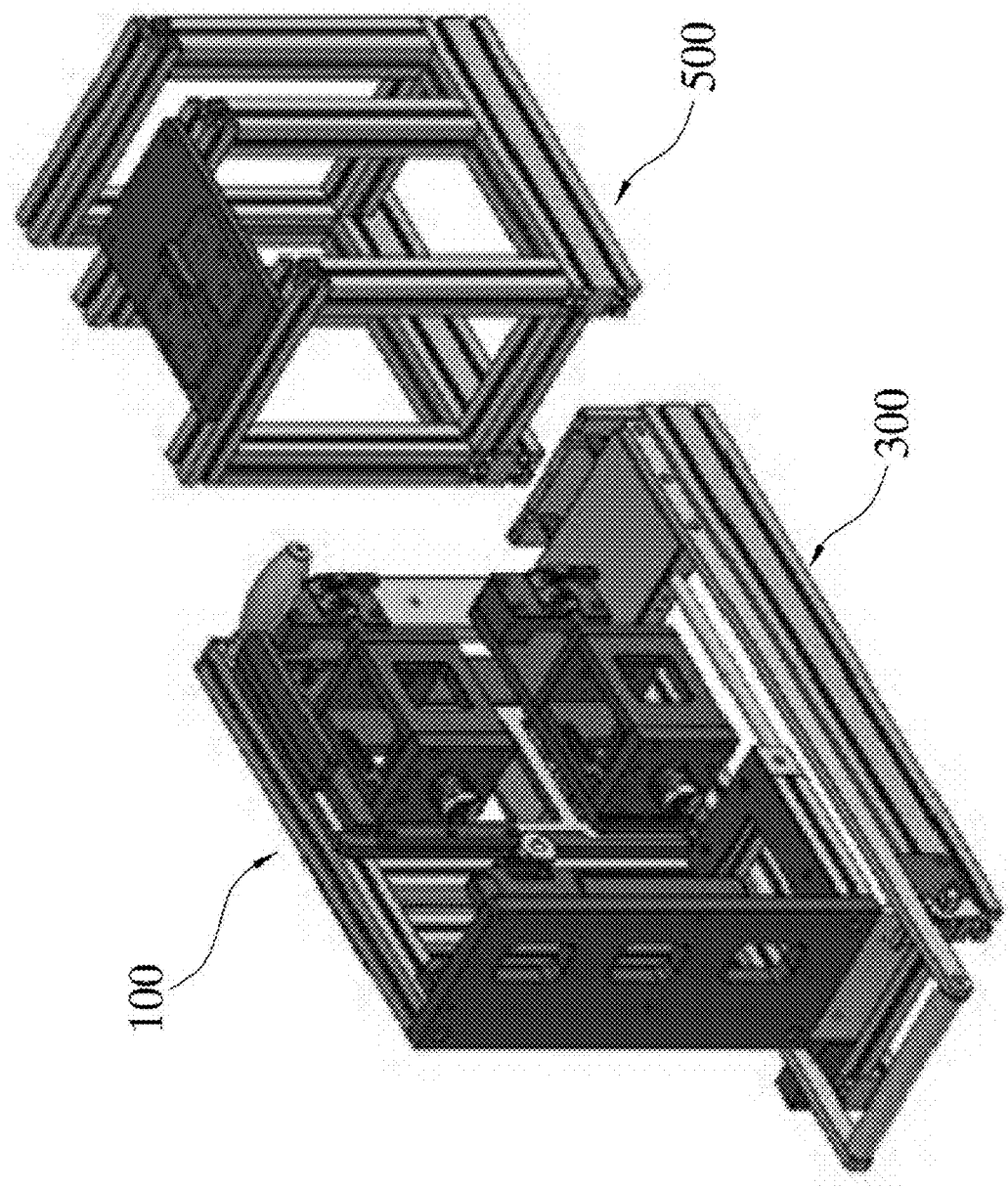
FIG. 13 is a perspective view showing a state in which a cell zig assembly shown in FIG. 1 has rotated by +90 degrees.
Figure 14:
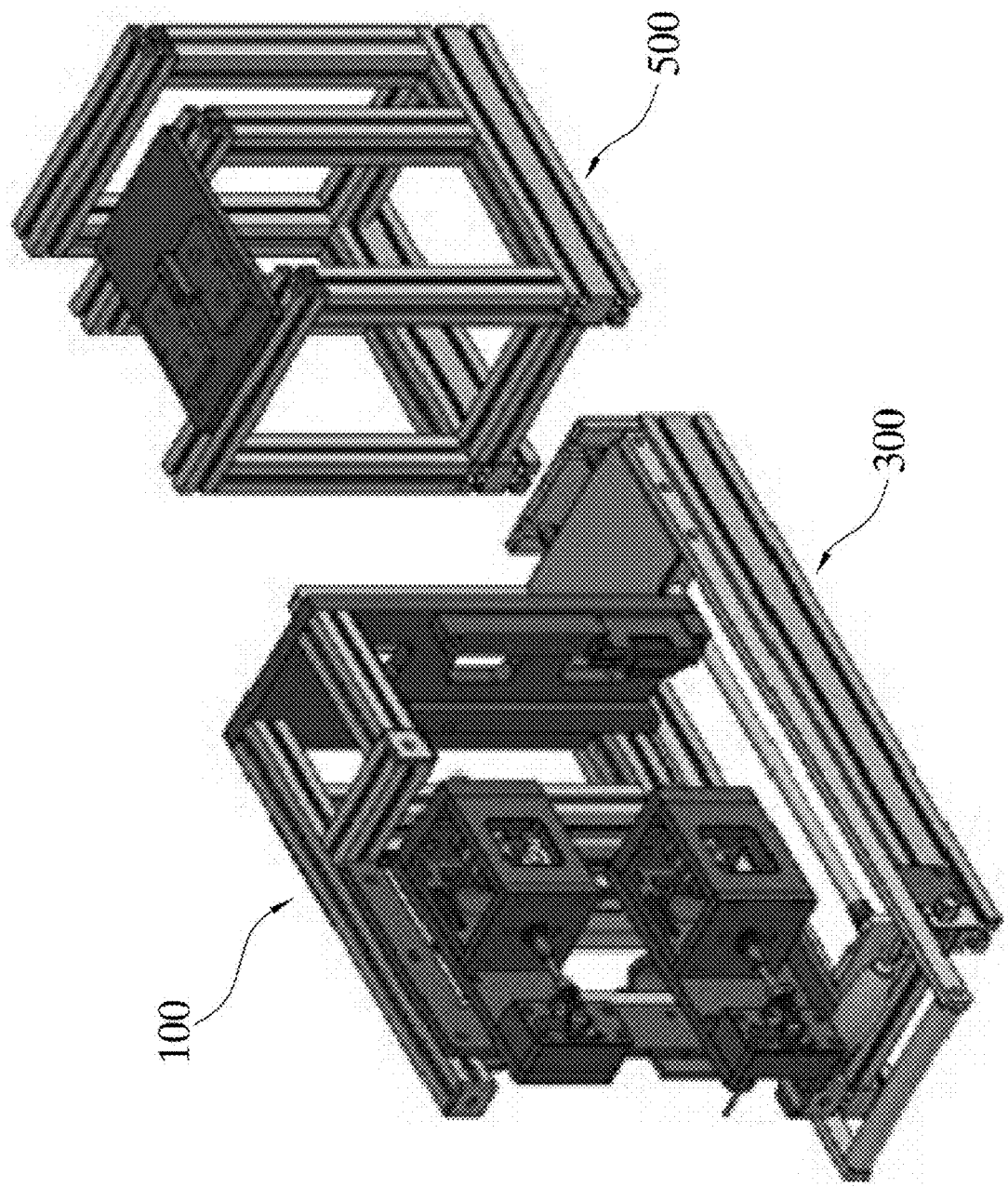
FIG. 14 is a perspective view showing a state in which a cell zig assembly shown in FIG. 1 has rotated by −90 degrees.

Hereinafter, a process of charging and discharging the secondary battery cell 20 using the universal jig for charging and discharging the secondary battery cell according to one embodiment of the present disclosure will be described with reference to FIG. 12 to FIG. 14.

Figure 12:
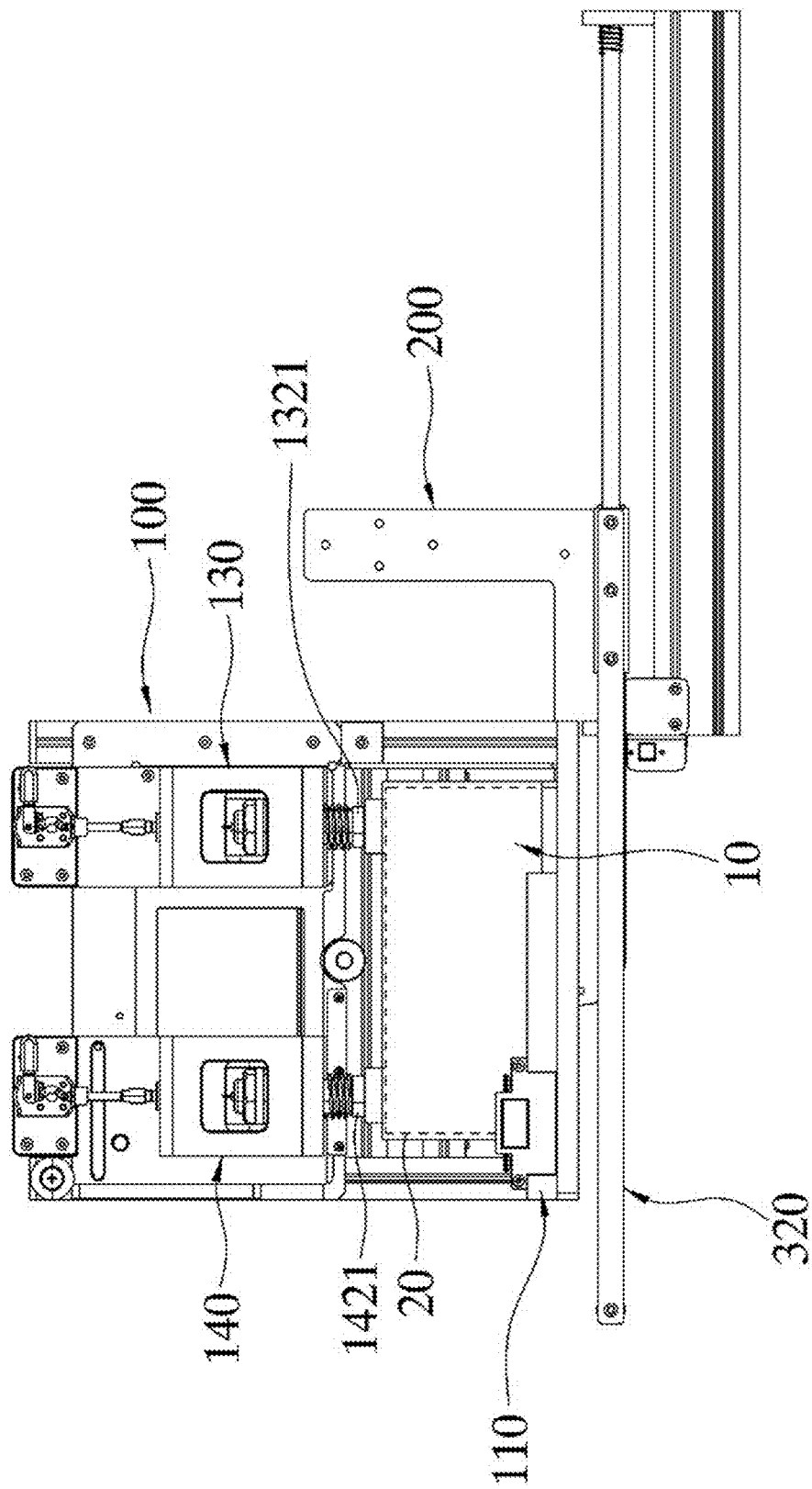
FIG. 12 is a diagram showing a state in which a sliding member and a cell zig assembly shown in FIG. 9 have been displaced.

FIG. 12 is a diagram showing a state in which a sliding member and a cell zig assembly shown in FIG. 9 have been displaced. FIG. 13 is a perspective view showing a state in which a cell zig assembly shown in FIG. 1 has rotated by +90 degrees. FIG. 14 is a perspective view showing a state in which a cell zig assembly shown in FIG. 1 has rotated by −90 degrees.

First, the secondary battery cell 20 is loaded onto the cell receiving part 110 in a state in which the cell 20 is covered with the first battery cover 11 and the second battery cover 12 of the battery protection member 10. In this connection, the negative electrode terminal 21 and the positive electrode terminal 22 of the secondary battery cell 20 may respectively face the zig 130 for the negative electrode terminal and the zig 140 for the positive electrode terminal.

Then, when the first toggle clamp 133 of the zig 130 for the negative electrode terminal has rotated clockwise, the first pin mounted block 131 and the first probe pin 132 are lowered toward the secondary battery cell 20. Thus, the first head 1321 of the first probe pin 132 comes in contact with the negative electrode terminal 21 of the secondary battery cell 20.

Then, the zig 140 for the positive electrode terminal has moved horizontally by a displacement according to the size of the secondary battery cell 20 such that the zig 140 for the positive electrode terminal is positioned on the positive electrode terminal 22 of the secondary battery cell 20. In this connection, the zig 140 for the positive electrode terminal may horizontally move while the second zig mounted plate 1223 of the zig mounted plate 122 slides along the first stepped portion 1221c and the second stepped portion 1221d of the base plate 1221.

After the zig 140 for the positive electrode terminal is disposed above and aligned with the positive electrode terminal 22 of the secondary battery cell 20, the second toggle clamp 143 has rotated clockwise. Thus, the second pin mounted block 141 and the second probe pin 142 are lowered toward the secondary battery cell 20 so that the second head 1421 of the second probe pin 142 comes in contact with the negative electrode terminal 21 of the secondary battery cell 20.

When power is applied to the wire part 500, current may be applied to the first probe pin 132 and the second probe pin 142 via the wire connector member 134 for the negative electrode of the zig 130 for the negative electrode terminal and the wire connector member 144 for the positive electrode of the zig 140 for the positive electrode terminal. The applied current is supplied to the secondary battery cell 20 to charge and discharge the secondary battery cell 20.

The charging/discharging process of the secondary battery cell 20 may be performed in a state in which the cell zig assembly 100 has been selectively rotated by +90 degrees or −90 degrees.

In order to rotate the cell zig assembly 100 by +90 degrees or −90 degrees, the cell zig assembly 100 may move away from the wire part 500 using the sliding guide member 310 as shown in FIG. 12. In this connection, after the operator presses the button 331 of the stopper 330 so that the engaged pin 332 is lowered so that the engaged pin 332 is spaced apart from the first stopper engaged groove 3221 of the second zig pulling bar 322. When the operator holds and pulls the pulling handle 324 of the sliding member 320, and thus pulls the first zig pulling bar 321 and the second zig pulling bar 322. Thus, the sliding plate 323 connected to the first zig pulling bar 321 and the second zig pulling bar 322 may move along the guide shafts 314 of the sliding guide member 310 and thus may move to a position of the second shaft holder 313. In this connection, the sliding plate 323 may be located close to the second shaft holder 313 without colliding with the second shaft holder 313 due to the shock-absorbing springs 340. The engaged pin 332 of the stopper 330 rises up and is fastened to the second stopper engaged groove 3222 of the second zig pulling bar 322 to maintain a state in which the sliding member 320 has moved.

In this process, the cell zig assembly 100 is spaced apart from the wire part 500 and the sliding guide member 310. In this state, the constraining pin 254 of the zig rotation inducing assembly 200 is spaced apart from the first constraining hole 251. Then, the operator holds the rotation inducing handle 400 and rotates the cell zig assembly 100 clockwise or counterclockwise. Thus, the cell zig assembly 100 has rotated by +90 degrees as shown in FIG. 13 or by −90 degrees as shown in FIG. 14. In this connection, the rotatable plate 210 rotates around the rotation center shaft 240. The rotatable plate 210 is connected to the zig mounted frame 121 of the cell zig assembly 100. Thus, the cell zig assembly 100 has rotated together with the rotatable plate 210.

When the cell zig assembly 100 has rotated by +90 degrees, the operators insert the constraining pin 254 into the second constraining hole 252 of the rotatable plate 210 to maintain the state in which the cell zig assembly 100 has rotated by +90 degrees. When the cell zig assembly 100 has rotated by −90 degrees, the constraining pin 254 is inserted into the third constraining hole 253 of the rotatable plate 210 to maintain the state in which the cell zig assembly 100 has rotated by −90 degrees.

The universal jig for charging and discharging the secondary battery cell according to one embodiment of the present disclosure may charge and discharge the secondary battery cell 20 in a forward state in which the negative electrode terminal 21 and the positive electrode terminal 22 of the secondary battery cell 20 face upwards, a state in which the secondary battery cell 20 has rotated by +90 degrees, and a state in which the secondary battery cell 20 had rotated by −90 degrees. Thus, the secondary battery cell 20 may rotate by various angles. The secondary battery cell 20 may be oriented vertically or horizontally. Thus, a charge/discharge test may be performed under conditions similar to an environment in which the battery is actually used.

Further, when the operator wants to rotate the secondary battery cell 20 and the cell zig assembly 100 in a state in which the secondary battery cell 20 and the cell zig assembly 100 are accommodated in a chamber for the charge/discharge test of the secondary battery cell 20, the operator may pull the cell zig assembly 100 via the sliding member 320 of the zig moving assembly 300 to withdraw the cell zig assembly 100 out of the chamber. In this state, the secondary battery cell 20 and the cell zig assembly 100 may rotate. Thus, the secondary battery cell 20 and the cell zig assembly 100 may be easily rotated without securing an additional space necessary for rotating the secondary battery cell 20 and the cell zig assembly 100 in addition to the chamber in which the charge/discharge test is performed.

While the present disclosure has been described with reference to preferred embodiments, those skilled in the art will appreciate that the present disclosure may be variously modified and changed without departing from the spirit and scope of the present disclosure set forth in the following claims.

What is claimed is:

1. A universal jig for charging and discharging a secondary battery cell, the universal jig comprising:
    a cell zig assembly including:
        a cell receiving part for receiving the secondary battery cell thereon; and
        a zig for a positive electrode terminal and a zig for a negative electrode terminal disposed above the cell receiving part and in contact with a positive electrode terminal and a negative electrode terminal of the secondary battery cell to apply current thereto, respectively; and
    a zig rotation inducing assembly connected, via a rotation center shaft thereof, to one face or an opposite face of the cell zig assembly on which the zig for the positive electrode terminal and the zig for the negative electrode terminal are disposed, wherein the zig rotation inducing assembly allows the cell zig assembly to rotate around the rotation center shaft.

2. The universal jig of claim 1, wherein the cell zig assembly is configured to rotate by an angle within 180 degrees around the rotation center shaft.

3. The universal jig of claim 1, wherein the zig rotation inducing assembly is configured to maintain a state in which the cell zig assembly has rotated by −90 degrees, 0 degree, or +90 degrees around the rotation center shaft.

4. The universal jig of claim 1, wherein the universal jig further comprises a zig moving assembly connected to a lower end of the zig rotation inducing assembly to move the zig rotation inducing assembly and the cell zig assembly in one direction and along a horizontal plane parallel to a bottom face of the cell receiving part.

5. The universal jig of claim 4, wherein said one direction is parallel to a direction in which the zig for the positive electrode terminal and the zig for the negative electrode terminal are adjacent to each other.

6. The universal jig of claim 4, wherein the zig moving assembly includes:
    a sliding guide member having a length direction parallel to said one direction; and
    a sliding member disposed on the sliding guide member so as to slide along the length direction of the sliding guide member, wherein the sliding member is connected to a lower end of the zig rotation inducing assembly.

7. The universal jig of claim 6, wherein the zig moving assembly further includes a plurality of shock-absorbing springs to prevent collision between the sliding member and the sliding guide member when the sliding member is sliding along the sliding guide member.

8. The universal jig of claim 6, wherein the cell zig assembly rotates in a state that the sliding member has moved by a predefined distance along the sliding guide member.

9. The universal jig of claim 1, wherein the universal jig further comprises a rotation inducing handle protruding from one face or an opposite face of the cell zig assembly on which the zig for the positive electrode terminal and the zig for the negative electrode terminal are disposed.

10. The universal jig of claim 1, wherein the zig for the positive electrode terminal includes a second probe pin, and a wire connector member for a positive electrode connected to the second probe pin,
 wherein the zig for the negative electrode terminal includes a first probe pin and a wire connector member for a negative electrode connected to the first probe pin,
 wherein a distal end of each of the wire connector member for the positive electrode and the wire connector member for the negative electrode protrudes in a rearward direction of each of the zig for the positive electrode terminal and the zig for the negative electrode terminal.

11. The universal jig of claim 1, wherein the cell receiving part further including a cell constraining member for constraining the secondary battery cell loaded onto the cell receiving part.

12. The universal jig of claim 11, wherein the cell receiving part includes a first rail and a second rail spaced apart from each other by a predefined distance,
 wherein the secondary battery cell is covered with a battery protection member and loaded between the first rail and the second rail,
 wherein the cell constraining member is disposed on a top face of one of the first rail and the second rail to press the battery protection member to constrain the secondary battery cell.

* * * * *